United States Patent
Liu et al.

(10) Patent No.: US 9,412,820 B2
(45) Date of Patent: Aug. 9, 2016

(54) SEMICONDUCTOR DEVICE WITH THINNED CHANNEL REGION AND RELATED METHODS

(71) Applicants: STMICROELECTRONICS, INC., Coppell, TX (US); INTERNATIONAL BUSINESS MACHINES CORPORATION, Armonk, NY (US)

(72) Inventors: Qing Liu, Watervliet, NY (US); Tenko Yamashita, Schenectady, NY (US); Chun-chen Yeh, Clifton Park, NY (US); Veeraraghavan S. Basker, Schenectady, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/456,272

(22) Filed: Aug. 11, 2014

(65) Prior Publication Data
US 2016/0043177 A1    Feb. 11, 2016

(51) Int. Cl.
*H01L 21/336*    (2006.01)
*H01L 29/10*    (2006.01)
*H01L 29/66*    (2006.01)
*H01L 29/786*    (2006.01)
*H01L 29/08*    (2006.01)

(52) U.S. Cl.
CPC ........ *H01L 29/1037* (2013.01); *H01L 29/0847* (2013.01); *H01L 29/66545* (2013.01); *H01L 29/66575* (2013.01); *H01L 29/66772* (2013.01); *H01L 29/78603* (2013.01)

(58) Field of Classification Search
CPC . H01L 2924/00; H01L 27/1203; H01L 21/84; H01L 29/66772; H01L 2224/48227; H01L 29/66545; H01L 29/66628; H01L 29/66795; H01L 2924/0002; H01L 29/785; H01L 2224/32225; H01L 2224/73265; H01L 21/08
USPC .......... 257/347, 529, E23.149; 438/199, 300, 438/285, 585
See application file for complete search history.

(56) References Cited

U.S. PATENT DOCUMENTS

| | | | |
|---|---|---|---|
| 6,660,598 B2 * | 12/2003 | Hanafi | H01L 29/66545 257/E21.415 |
| 7,479,423 B2 * | 1/2009 | Yagishita | H01L 27/1203 257/E21.703 |
| 2012/0104498 A1 * | 5/2012 | Majumdar et al. | 257/351 |
| 2013/0193514 A1 | 8/2013 | Loubet et al. | |
| 2014/0027854 A1 * | 1/2014 | Asenov | H01L 29/66477 257/348 |

* cited by examiner

*Primary Examiner* — Kimberly Rizkallah
*Assistant Examiner* — Maria Ligai
(74) *Attorney, Agent, or Firm* — Seed IP Law Group PLLC

(57) ABSTRACT

A method for making a semiconductor device may include forming a dummy gate above a semiconductor layer on an insulating layer, forming sidewall spacers above the semiconductor layer and on opposing sides of the dummy gate, forming source and drain regions on opposing sides of the sidewall spacers, and removing the dummy gate and underlying portions of the semiconductor layer between the sidewall spacers to provide a thinned channel region having a thickness less than a remainder of the semiconductor layer outside the thinned channel region. The method may further include forming a replacement gate stack over the thinned channel region and between the sidewall spacers and having a lower portion extending below a level of adjacent bottom portions of the sidewall spacers.

14 Claims, 4 Drawing Sheets

SEMICONDUCTOR DEVICE WITH THINNED CHANNEL REGION AND RELATED METHODS

FIELD OF THE INVENTION

The present invention relates to the field of electronic devices and, more particularly, to semiconductor devices and related methods.

BACKGROUND

Some semiconductor devices utilize semiconductor-on-insulator (SOI) technology, in which a thin layer of a semiconductor (typically having a thickness of a few nanometers), such as silicon, is separated from a semiconductor substrate by a relatively thick electrically insulating layer (typically featuring a thickness of a few tens of nanometers). Integrated circuits using SOI technology offer certain advantages compared to traditional "bulk" technology for Complementary Metal Oxide Semiconductor (CMOS) integrated circuits. For example, SOI integrated circuits typically provide a lower power consumption for a same performance level.

SOI circuits may also feature a reduced stray capacitance, allowing an increase of commutation speeds. Furthermore, the latch-up phenomena encountered in bulk technology may be mitigated. Such circuits are commonly used in System on Chip (SoC) and Micro electro-mechanical systems (MEMS) applications. SOI circuits may also be less sensitive to ionizing radiations, making them more reliable than bulk-technology circuits in applications where radiation may induce operating problems (e.g., aerospace applications). SOI integrated circuits may include memory components such as Static Random Access Memory (SRAM), as well as logic gates.

One particular type of SOI technology that is helping to allow for continued CMOS scaling is fully depleted SOI (FDSOI). As opposed to a partially depleted SOI (PDSOI) device, in an FDSOI device a relatively thin semiconductor channel film is provided over the buried oxide (BOX) layer, such that the depletion region of the device covers the whole film. FDSOI devices may provide advantages such as higher switching speeds and a reduction in threshold voltage roll off, as compared to PDSOI devices, for example.

One example FDSOI configuration is set forth in U.S. Pat. Pub. No. 2013/0193514 to Loubet et al. This reference discloses a method for making an FDSOI device in which an SOI substrate has a first region isolated from a second region. An SiGe layer is deposited on top of the SOI substrate in the second region. The substrate is subjected to a thermal oxidation process which drives in Ge from the SiGe layer to form an SiGeOI structure in the second region and an overlying oxide layer. If the SOI substrate is exposed in the first region, the thermal oxidation process further produces an oxide layer overlying the first region. The oxide layer(s) is(are) removed to expose an Si channel layer in the first region and an SiGe channel layer in the second region. Transistor gate stacks are formed over each of the Si channel layer and SiGe channel layer. Raised source and drain regions are formed from the Si channel layer and SiGe channel layer adjacent the transistor gate stacks.

Despite the existence of such configurations, further enhancements in SOI devices may be desirable in some applications.

SUMMARY

A method for making a semiconductor device may include forming a dummy gate above a semiconductor layer on an insulating layer, forming sidewall spacers above the semiconductor layer and on opposing sides of the dummy gate, forming source and drain regions on opposing sides of the sidewall spacers, and removing the dummy gate and underlying portions of the semiconductor layer between the sidewall spacers to provide a thinned channel region having a thickness less than a remainder of the semiconductor layer outside the thinned channel region. The method may further include forming a replacement gate stack over the thinned channel region and between the sidewall spacers and having a lower portion extending below a level of adjacent bottom portions of the sidewall spacers.

More particularly, the thinned channel region may have a thickness in a range of 50 to 75% of the thickness of the remainder of the channel layer. By way of example, the thinned channel region may have a thickness in a range of 5 nm to 6 nm, and the remainder of the channel layer may have a thickness in a range of 8 nm to 9 nm.

Forming the source and drain regions may include forming raised source and drain regions above the semiconductor layer on opposing sides of the sidewall spacers. Furthermore, the insulating layer may comprise a buried oxide (BOX) layer defining a fully-depleted semiconductor-on-insulator (FDSOI) configuration with the semiconductor layer. Forming the replacement gate stack may include forming a replacement metal gate stack, and forming the sidewall spacers may include forming nitride spacers. By way of example, the semiconductor layer may comprise at least one of silicon and germanium.

A related semiconductor device may include a substrate, an insulating layer on the substrate, a semiconductor layer on the insulating layer and having a thinned channel region therein with a thickness less than a remainder of the semiconductor layer outside the thinned channel region, and a gate stack over the thinned channel region. The semiconductor device may further include sidewall spacers above the semiconductor layer and on opposing sides of the gate stack gate, with the gate stack having a lower portion extending below a level of adjacent bottom portions of the sidewall spacers. Source and drain regions may be on opposing sides of the sidewall spacers.

DETAILED DESCRIPTION OF THE EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

By way of background, as CMOS development continues in its scaling trend, fully depleted devices (e.g., FINFET/Trigate and ultra-thin body BOX (UTBB)) have been the focal point for the better short channel control. In fully depleted devices, to have desired electrostatics (i.e., short channel control), the channel thickness generally needs to be relatively thin, with a rule of thumb being that the thickness is approximately one quarter of the gate length. However, with such a thin channel, the extension resistance (i.e., the resistance under the spacer close to the channel) may become problematic. Furthermore, the process margin may be relatively low for such channel thicknesses, as the gate reactive ion etch (RIE)/spacer RIE may further thin down the FIN/SOI, and may accordingly result in cutting off the channel region from the source/drain region, as will be appreciated by those skilled in the art.

Generally speaking, an approach is provided herein which allows for a relatively thick semiconductor layer to be used to form the device structure, yet while still achieving a relatively thin channel area and the associated advantages thereof. In accordance with an example approach, after source/drain formation, during the replacement gate formation process when the dummy gate is removed, the semiconductor layer in the channel region is etched or thinned down to the desired thickness prior to formation of the final replacement gate stack. This provides a relatively thin channel but with thicker extension regions (i.e., below the gate sidewall spacers) to provide lower extension resistance. In the meantime, the dummy gate RIE and spacer RIE margin are both improved due to the thicker silicon layer.

Figure 1:
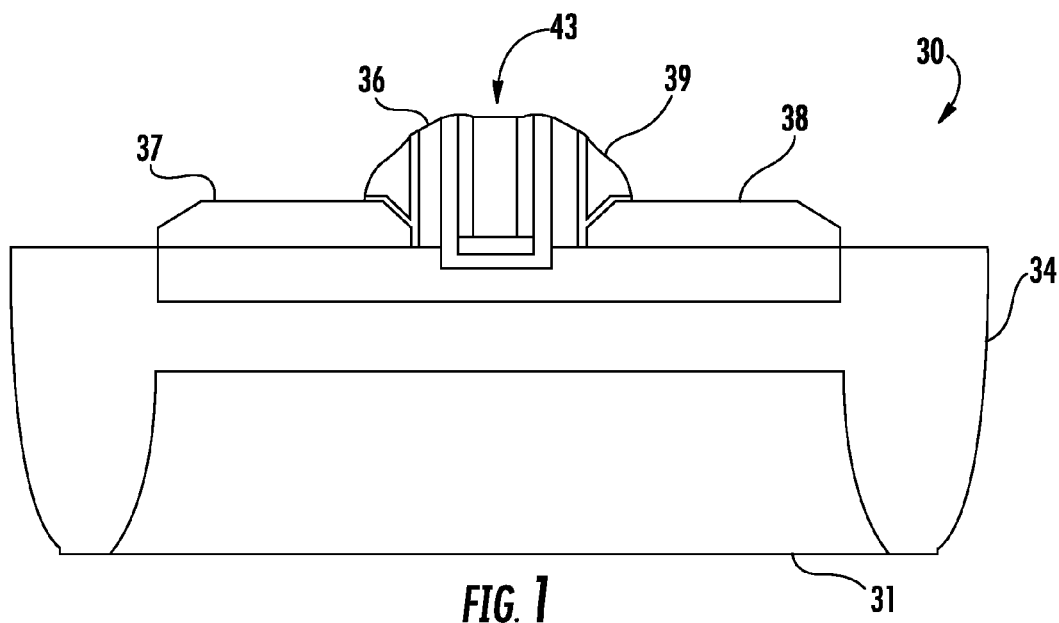
FIG. 1 is cross-sectional diagram of a semiconductor device in accordance with an example embodiment.

Turning now to FIG. 1, this approach and an associated semiconductor device 30 produced thereby are first described. The method begins with a OTBB FDSOI wafer including a semiconductor (e.g., silicon) substrate 31, a BOX layer 32 on the substrate, and a semiconductor (e.g., monocrystalline silicon) layer 33 on the BOX layer. In the illustrated example, shallow trench isolation (STI) regions 34 are also included for separating adjacent electrical devices (e.g., transistors) from one another. While the examples set forth herein are silicon devices, it will be appreciated that the techniques presented may be used with other semiconductor configurations, including silicon germanium, III-V materials, etc.

As noted above, for the present approach, a relatively thick semiconductor layer 33 is used compared to the normal thickness for a given process node. For the present example a 14 nm process node is assumed, for which an approximate 8 nm to 9 nm thickness may be used for the semiconductor layer 33, although other thicknesses and process nodes (e.g., 10 nm, 28 nm, etc.) may be used in different embodiments.

Figure 2:
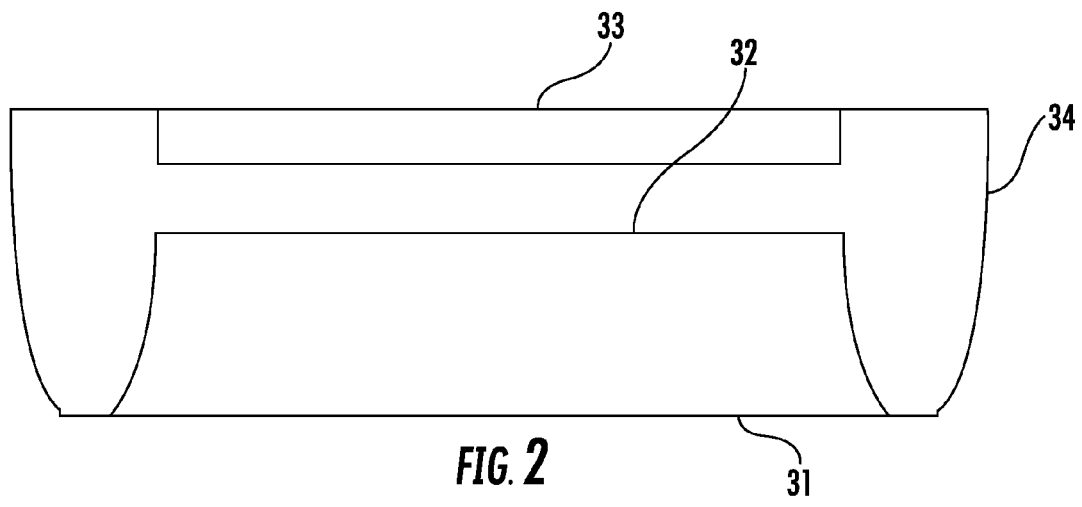
FIGS. 2-7 are series of cross-sectional diagrams illustrating method aspects associated with making the semiconductor device of FIG. 1 in accordance with an example embodiment.
Figure 3:
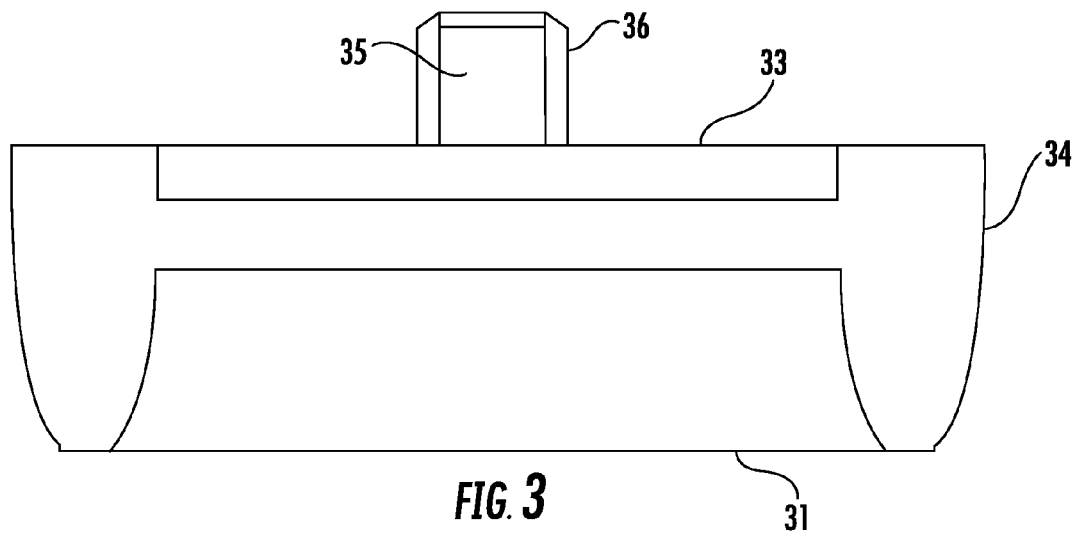
Figure 4:
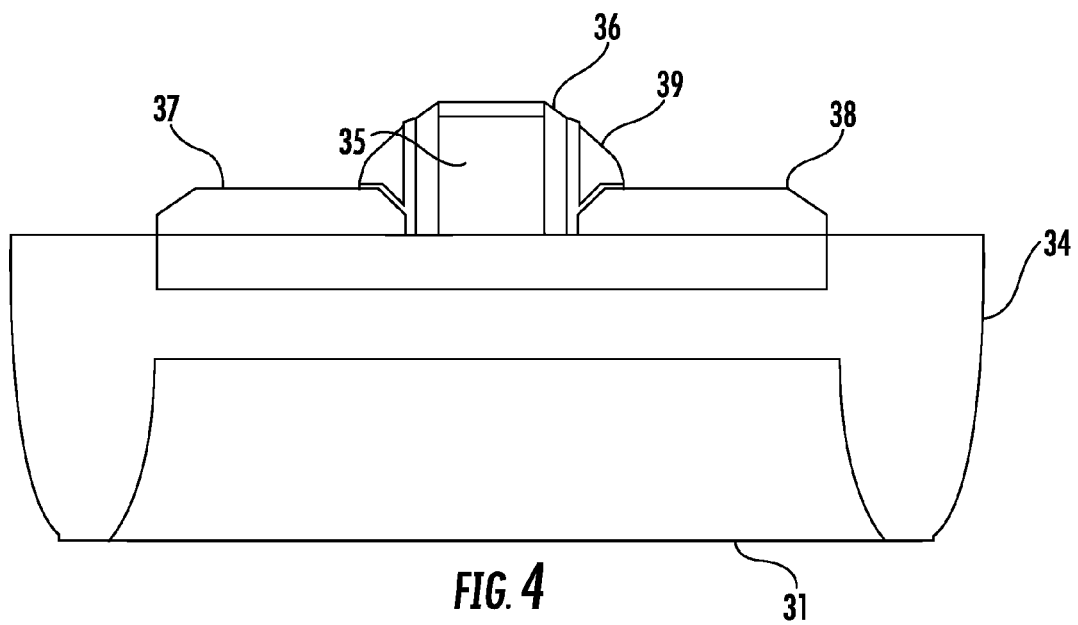

As seen in FIGS. 2 and 3, a dummy gate (e.g., polysilicon) 35 is formed on the semiconductor layer 33 over the location of the channel, and associated sidewall spacers 36 (e.g., silicon nitride, SiN) are also formed on sidewalls of the dummy gate. In the present example, raised source and drain regions 37, 38 are formed (e.g., via epitaxial silicon growth) on the semiconductor layer 33 on opposite sides of the dummy gate 35 and sidewall spacers 36, as shown in FIG. 4. Secondary sidewall spacers 39 (e.g., SiN, SiBCN, SiOCN) are also formed laterally adjacent the sidewall spacers 36 and partially overlying the source and drain regions 37, 38. However, it should be noted that different configurations may be used in some embodiments. For example, raised source and drain regions need not be used in all configurations, and the source and drain regions may instead be formed directly in the semiconductor layer 33, for example, by initially forming the semiconductor layer to a desired thickness and implanting an appropriate dopant in the regions where the source and drain are to be located, as will be appreciated by those skilled in the art.

Figure 5:
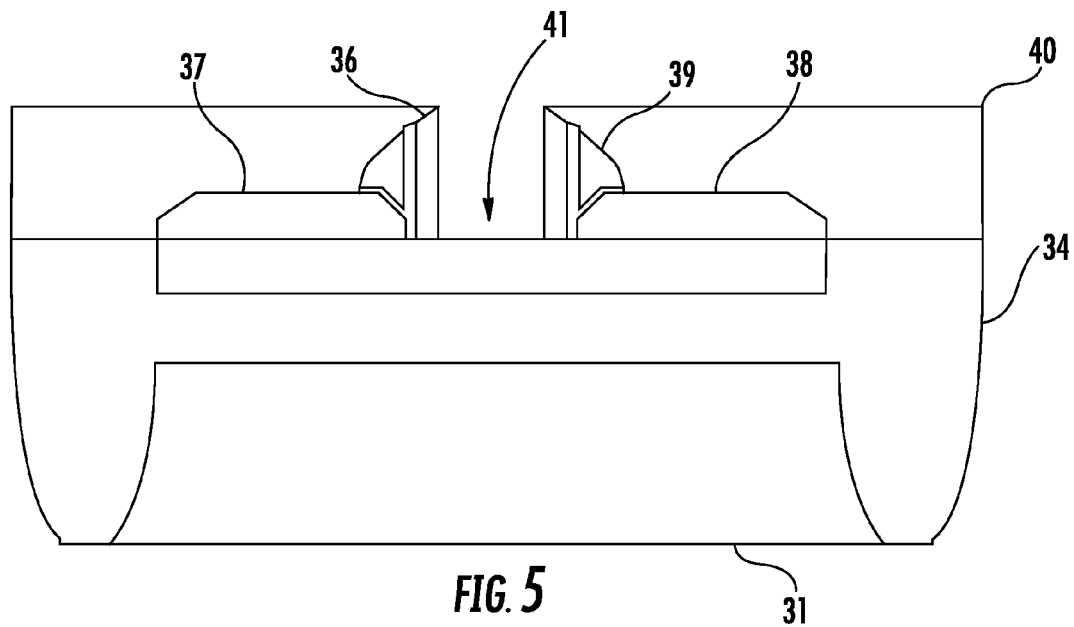
Figure 6:
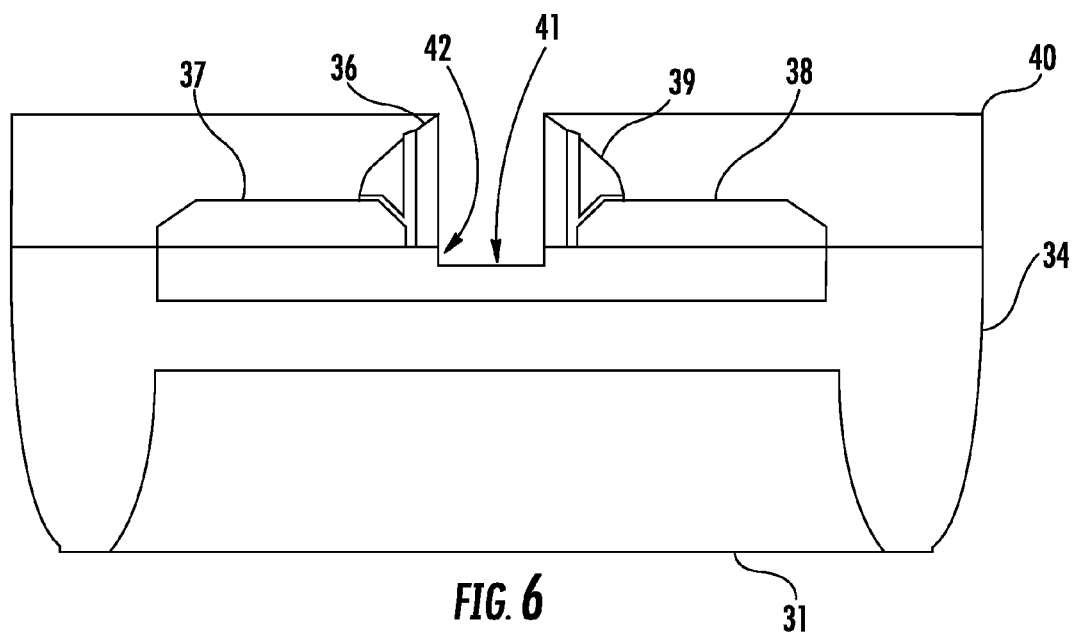

An oxide 40 (e.g., $SiO_2$) may be filled over the source and drain regions 37, the spacers 36, 39, and the dummy gate 35 and patterned (e.g., via chemical-mechanical polishing, CMP) to stop on the gate nitride hard mask, and the gate mask and dummy gate may be removed, as seen in FIG. 5. As such, this allows the channel region 41 which was beneath the dummy gate 35 to be thinned down to the desired thickness, such as by wet (e.g., SC1) or dry (e.g., HCl) etching as seen in FIG. 6. By way of example, for the 14 nm process node mentioned above, the semiconductor layer 33 may be about 8 nm to 9 nm thick, and the channel region 41 may be thinned to about 5 nm to 6 nm, although other dimensions may be used in different embodiments. Considered alternatively, the thinned channel region 41 may have a thickness in a range of about 50 to 75% of the thickness of the remainder of the channel layer, for example.

Figure 8:
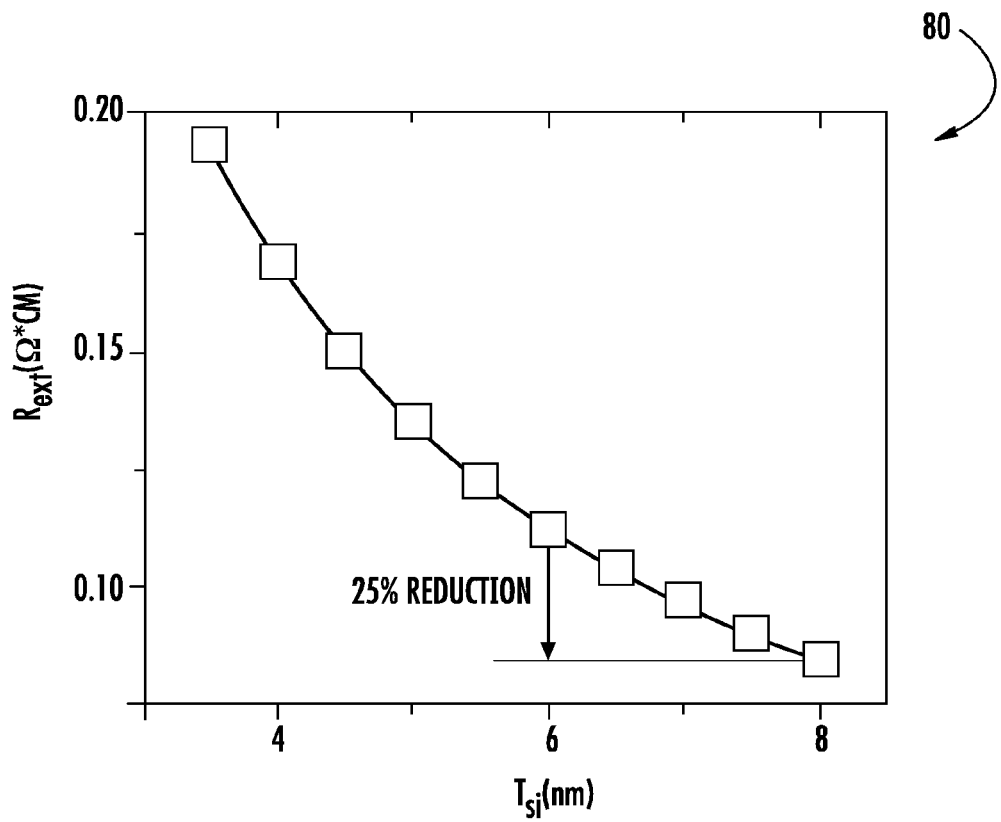
FIG. 8 is a graph of extension resistance vs. silicon layer thickness in accordance with example embodiments.

Thus, the extension regions 42 directly adjacent the ends of the thinned channel area or region 41 remain of the original thickness (e.g., 8 nm), while the channel region is thinner (e.g., 5 nm to 6 nm). As shown in the graph 80 of FIG. 8, for example, the use of an 8 nm thickness for the extension regions instead of a 6 nm extension region results in approximately a 25% reduction in extension resistance.

Figure 7:
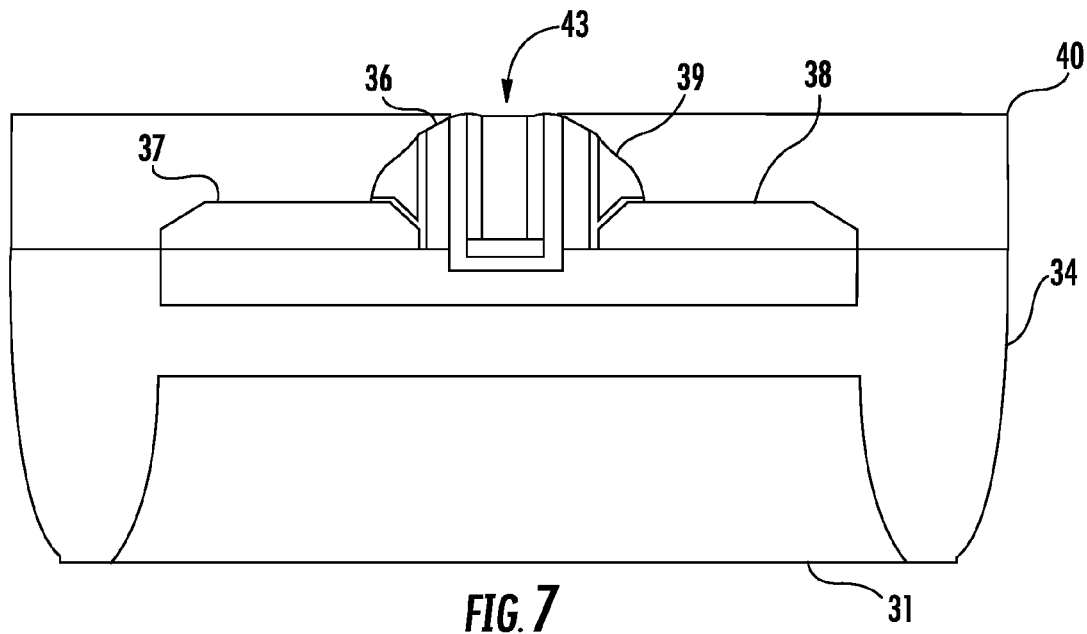

After thinning of the channel region 41, a standard gate replacement process may be used to form the final gate stack 43 overlying the channel region 41 and between the spacers 36, as seen in FIG. 7. For example, the gate stack 43 may be a replacement metal gate stack, although other gate configurations may be used in different embodiments. The oxide layer 40 may be removed and subsequent conventional processing steps may be performed as appropriate to provide the completed semiconductor device 30 shown in FIG. 1, as will be appreciated by those skilled in the art.

It should be noted that while the semiconductor device 30 and method for making the same have been described herein with respect to UTBB and FDSOI, other SOI configurations (e.g., conventional SOI, PDSOI, etc.) may also be used in different embodiments. Moreover, in some embodiments the semiconductor device 30 may be configured with a "back" gate, in which the body of the device is biased on the backside of the substrate 31, as will be appreciated by those skilled in the art. In addition to the lower extension resistance noted above, another advantage of the above-described approach is that this may provide for a reduction in wafer costs. More particularly, because the entire silicon layer 33 need not be formed or thinned to the relatively thin channel thickness, this may lead to a relatively easier, and less costly, wafer fabrication process.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:

forming a dummy gate above a semiconductor layer on an insulating layer;

forming sidewall spacers above the semiconductor layer and on opposing sides of the dummy gate;

forming source and drain regions on opposing sides of the sidewall spacers;

removing the dummy gate and underlying portions of the semiconductor layer between the sidewall spacers to provide a thinned channel region having a thickness in a range of 50 to 75% of a remainder of the semiconductor layer outside the thinned channel region; and forming a replacement gate stack over the thinned channel region and between the sidewall spacers and having a lower portion extending below a level of adjacent bottom portions of the sidewall spacers so that the replacement gate stack defines a channel of the semiconductor device within the thinned channel region;

wherein the thinned channel region has a thickness in a range of 5 nm to 6 nm; and wherein the remainder of the semiconductor layer has a thickness in a range of 8 nm to 9 nm.

2. The method of claim 1 wherein the insulating layer comprises a buried oxide (BOX) layer defining a fully-depleted semiconductor-on-insulator (FDSOI) configuration with the semiconductor layer.

3. The method of claim 1 wherein forming the replacement gate stack comprises forming a replacement metal gate stack.

4. The method of claim 1 wherein forming the sidewall spacers comprises forming nitride spacers.

5. The method of claim 1 wherein the semiconductor layer comprises at least one of silicon and germanium.

6. A method for making a semiconductor device comprising:

forming a dummy gate above a semiconductor layer on a buried oxide (BOX) layer defining a fully-depleted semiconductor-on-insulator (FDSOI) configuration with the semiconductor layer;

forming sidewall spacers above the semiconductor layer and on opposing sides of the dummy gate;

forming raised source and drain regions above the semiconductor layer on opposing sides of the dummy gate;

removing the dummy gate and underlying portions of the semiconductor layer between the sidewall spacers to provide a thinned channel region having a thickness in a range of 50 to 75% of a remainder of the semiconductor layer outside the thinned channel region; and forming a replacement gate stack over the thinned channel region and between the sidewall spacers and having a lower portion extending below a level of adjacent bottom portions of the sidewall spacers so that the replacement gate stack defines a channel of the semiconductor device within the thinned channel region;

wherein the thinned channel region has a thickness in a range of 5 nm to 6 nm; and wherein the remainder of the semiconductor layer has a thickness in a range of 8 nm to 9 nm.

7. The method of claim 6 wherein forming the replacement gate stack comprises forming a replacement metal gate stack.

8. The method of claim 6 wherein forming the sidewall spacers comprises forming nitride spacers.

9. The method of claim 6 wherein the semiconductor layer comprises at least one of silicon and germanium.

10. A method for making a semiconductor device comprising:

forming a dummy gate above a semiconductor layer on an insulating layer;

forming sidewall spacers above the semiconductor layer and on opposing sides of the dummy gate;

forming raised source and drain regions on opposing sides of the sidewall spacers;

removing the dummy gate and underlying portions of the semiconductor layer between the sidewall spacers to provide a thinned channel region having a thickness less than a remainder of the semiconductor layer outside the thinned channel region, the thinned channel region having a thickness in a range of 50 to 75% of the thickness of the remainder of the semiconductor layer; and forming a replacement gate stack over the thinned channel region and between the sidewall spacers and having a lower portion extending below a level of adjacent bottom portions of the sidewall spacers so that the replacement gate stack defines a channel of the semiconductor device within the thinned channel region;

wherein the thinned channel region has a thickness in a range of 5 nm to 6 nm; and wherein the remainder of the semiconductor layer has a thickness in a range of 8 nm to 9 nm.

11. The method of claim 10 wherein the insulating layer comprises a buried oxide (BOX) layer defining a fully-depleted semiconductor-on-insulator (FDSOI) configuration with the semiconductor layer.

12. The method of claim 10 wherein forming the replacement gate stack comprises forming a replacement metal gate stack.

13. The method of claim 10 wherein forming the sidewall spacers comprises forming nitride spacers.

14. The method of claim 10 wherein the semiconductor layer comprises at least one of silicon and germanium.

* * * * *